(12) United States Patent
Koriyama et al.

(10) Patent No.: US 6,642,808 B2
(45) Date of Patent: Nov. 4, 2003

(54) HIGH FREQUENCY PACKAGE, WIRING BOARD, AND HIGH FREQUENCY MODULE HAVING A CYCLICALLY VARYING TRANSMISSION CHARACTERISTIC

(75) Inventors: Shinichi Koriyama, Kokubu (JP); Kenji Kitazawa, Kokubu (JP); Naoyuki Shino, Kokubu (JP); Hidehiro Minamiue, Kokubu (JP)

(73) Assignee: Kyocera Corporation, Kyoto (JP)

( * ) Notice: Subject to any disclaimer, the term of this patent is extended or adjusted under 35 U.S.C. 154(b) by 81 days.

(21) Appl. No.: 09/871,591

(22) Filed: May 30, 2001

(65) Prior Publication Data

US 2002/0003298 A1 Jan. 10, 2002

(30) Foreign Application Priority Data

May 30, 2000 (JP) ........................................ 2000-160750

(51) Int. Cl.[7] .............................. H01P 5/00; H03H 7/38
(52) U.S. Cl. .......................... 333/33; 333/247; 257/728
(58) Field of Search ................................. 333/247, 246, 333/33; 257/728

(56) References Cited

U.S. PATENT DOCUMENTS 5,768,109 A * 6/1998 Gulick et al. ........... 333/247 X
6,046,653 A * 4/2000 Yamada ................... 333/247 X

* cited by examiner

Primary Examiner—Benny Lee
(74) Attorney, Agent, or Firm—Hogan & Hartson

(57) ABSTRACT

A high frequency package is arranged such that it comprises a dielectric substrate provided with an input terminal and an output terminal, a high frequency element mounted on the surface of the dielectric substrate, and a high frequency line formed on the dielectric substrate for connecting the high frequency element with the input terminal and with the output terminal, wherein a transmission characteristic from the input terminal to the output terminal has the property of cyclically varying in relation to frequency. The length of the high frequency line is regulated such that the frequency of signals transmitted along the high frequency line is located at a part of the cyclic variation curve of the transmission characteristic where transmittance is large. By arranging the structure in such a manner, loss of high frequency signals having frequencies of 10 GHz or more can be reduced.

11 Claims, 5 Drawing Sheets

TRANSMITTANCE CHARACTERISTIC
IN THE CASE OF Lp = 5.6mm

TRANSMITTANCE CHARACTERISTIC
IN THE CASE OF Lp = 6.0mm

HIGH FREQUENCY PACKAGE, WIRING BOARD, AND HIGH FREQUENCY MODULE HAVING A CYCLICALLY VARYING TRANSMISSION CHARACTERISTIC

This application is based on application No. 2000-160750 filed in Japan, the content of which is incorporated hereinto by reference.

BACKGROUND OF THE INVENTION

1. Field of the Invention

The present invention relates to a high frequency package, a wiring board and a high frequency module, in which high frequency elements are loaded and high frequency signals having frequencies of 10 GHz or more are transmitted.

2. Description of the Related Art

In the recent highly information-driven society, utilization of radio waves for information transmission has been under study in which radio waves ranging from microwaves whose frequency range is 1–30 GHz to millimeter waves whose frequency range is 30–300 GHz are dealt with. Application systems using millimeter waves, for example, vehicle interval radars have been proposed.

As a structure of high frequency module adopted in such systems, the structure of a known multichip high frequency package, in which a plurality of high frequency elements are mounted on one substrate and hermetically sealed altogether by a case, is the mainstream.

A schematic sectional view of this known multichip high frequency package is shown in FIG. 5. A multichip high frequency package 31 comprises a dielectric substrate 32, a frame 33, a cap 34, and a plurality of high frequency elements 35 sealed within the package. Each of the high frequency elements 35 is connected with a high frequency line 36 formed on the surface of the dielectric substrate 32 by a wire bonding 37.

Such a multichip high frequency package needs to have a large size for arranging the necessary high frequency circuit within the package. As a result, this has a problem in the yield of hermetic sealing caused by camber of the substrate, deformation of the frame and the cap or the like.

In order to solve this problem, another kind of high frequency module has been considered. In this module, each high frequency element is separately packaged, hermetically sealed and mounted on a substrate so that the individual high frequency packages are connected with one another by a high frequency line on the wiring board.

However, in the case of such a high frequency module having high frequency packages each of which includes a high frequency element separately and is mounted on the wiring board, when the signal frequency is as high as 10 GHz or more, reflection of the high frequency signals becomes great in areas where the high frequency packages are connected with the wiring board. Loss in such areas is so great that it is hard to obtain the required performance, making it very difficult to use high frequency modules in this mode.

It is an object of the present invention to provide a high frequency package loaded with high frequency elements, a wiring board on which the high frequency packages are mounted, and a high frequency module with the high frequency packages incorporated thereinto having a structure capable of reducing loss of high frequency signals especially those having frequencies of 10 GHz or more.

SUMMARY OF THE INVENTION

After accumulating studies on the loss of signals in high frequency modules having high frequency packages that are loaded with high frequency elements and mounted on a wiring board, the present inventors focused on the fact that a transmission characteristic of signals transmitted from a terminal to the other terminal had the property of cyclically varying in relation to frequency, and have found out that loss of high frequency signals could be reduced by regulating the high frequency line between each set of terminals in the high frequency package and the wiring board such that the frequency of signals transmitted along the high frequency line corresponds to the frequency located at a peak part (where transmittance is large) of the cyclic variation curve of the transmission characteristic.

A high frequency package according to the present invention is characterized in that a transmission characteristic of signals (which is the same as the insertion loss and corresponds to S21 in S parameter) transmitted from an input terminal to an output terminal has the property of cyclically varying in relation to frequency, and that the frequency of signals transmitted along a high frequency line inside the high frequency package corresponds to that at a part of the cyclic variation curve of the transmission characteristic where transmittance is large.

The wiring board according to the present invention is one that has at least two high frequency packages mounted thereon, in which a transmission characteristic from one terminal portion to the other terminal portion on a high frequency line connecting the two high frequency packages has the property of cyclically varying in relation to frequency, and the frequency of signals transmitted along the high frequency line corresponds to that at a part of the cyclic variation curve of the transmission characteristic where transmittance is large.

In addition, according to the present invention, a high frequency module may be arranged such that the high frequency packages having the specific structure above are mounted on a wiring board that comprises a high frequency line formed on the surface of a dielectric substrate, and that at least two high frequency packages loaded with high frequency elements are mounted on the wiring board having the specific structure above.

Furthermore, the most desirable high frequency module according to the present invention is arranged such that the high frequency packages having the specific structure above in which transmission loss is reduced are mounted on the wiring board having the specific structure above in which transmission loss is reduced.

Generally, in a high frequency module in which a high frequency package is mounted on a wiring board, when the frequency becomes as high as 10 GHz or more, signals reflect in areas where the high frequency package is connected with the wiring board causing the loss thereof to be large. According to the present invention, however, the length of the high frequency line between the input terminal and the output terminal in the high frequency package and the length of the high frequency line between the high frequency packages connecting the high frequency packages on the wiring board are regulated, and the cycle of the frequency variation of the transmission characteristic in accordance with each length is adjusted such that the signal frequency is located at a peak part of the cyclic variation curve of the transmission characteristic, thereby reducing transmission loss in the high frequency package and the wiring board, and accordingly reducing transmission loss in the high frequency module comprising the high frequency packages mounted on the wiring board.

The peak part of the cyclic variation curve should preferably satisfy the following mathematical formula:

$$f_1+\{(f_2-f_1)/4\} \leq f_0 \leq f_2-\{(f_2-f_1)/4\} \quad \text{[Formula 1]}$$

where $f_0$ represents the frequency of signals transmitted along the high frequency line, $f_1$ represents the frequency on the cyclic variation curve of the transmission characteristic at a part on the lower frequency side adjacent to $f_0$, where transmittance is small, and $f_2$ represents the frequency on the curve at a part on the higher frequency side adjacent to $f_0$, where transmittance is small.

Moreover, it is preferable for the length of the high frequency line along which signals are transmitted to be $(2n+1)\lambda/4$ (n: an integral number, $\lambda$: wavelength of the signal frequency). This makes it possible to suppress transmittance loss due to the connection.

As discussed so far, the high frequency package, the wiring board and the high frequency module according to this invention are arranged such that the length of the high frequency line between the input terminal and the output terminal in the high frequency package and the length of the high frequency line connecting two high frequency packages on the wiring board are regulated in accordance with the wavelength of signals to be transmitted, and the frequency of the signals to be transmitted is controlled so as to be located at a peak part of the cyclic variation curve of the transmission characteristic, thereby bringing the reflection down to a minimum value and accordingly bringing the loss down to a minimum value. Reduction of loss due to the connection is therefore made possible, and a high frequency module that can deal with frequencies as high as 10 GHz or more can be realized in a mode in which high frequency packages are mounted on a wiring board.

Specific structural details of the present invention are hereinafter described referring to the appended drawings.

DETAILED DESCRIPTION OF THE INVENTION

Figure 1A:
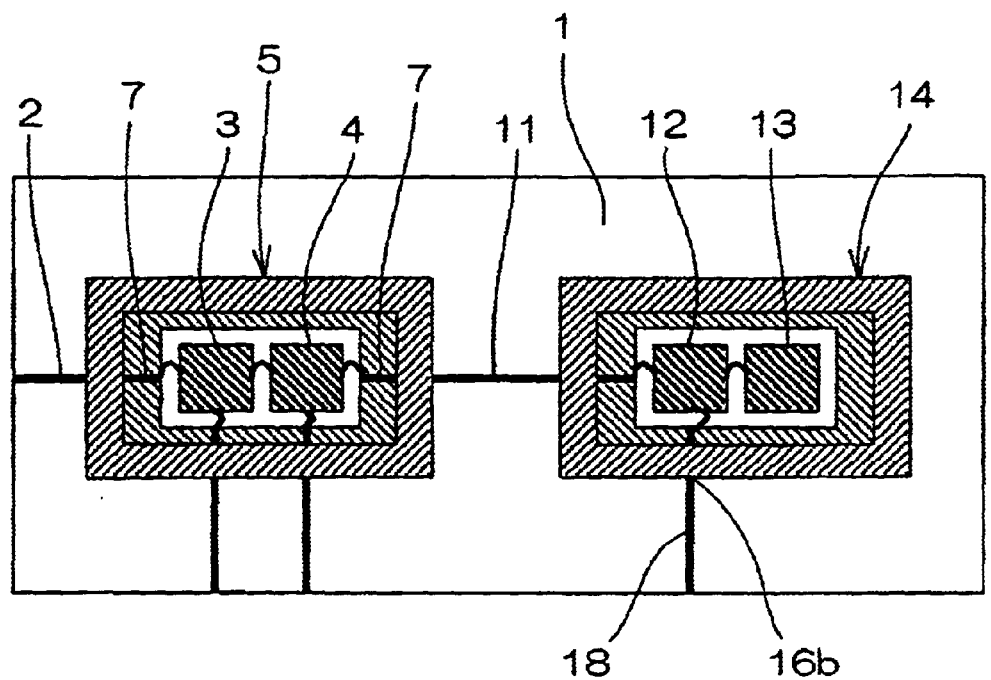
FIG. 1A is a schematic plan view illustrating an embodiment of the high frequency module according to the present invention.
Figure 1B:
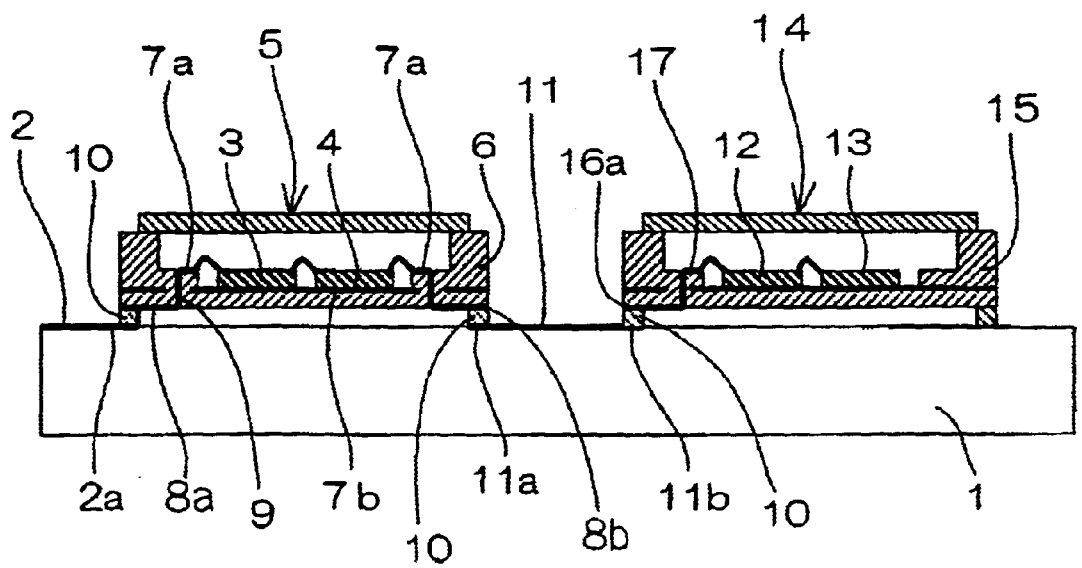
FIG. 1B is a schematic sectional view of the above embodiment.

FIG. 1A is a schematic plan view of a high frequency module according to this invention, and FIG. 1B is a schematic sectional view of the same.

In this high frequency module, a high frequency line 2 for inputting high frequency signals connected to an outer antenna is formed on one end of a wiring board 1. In an end portion of this high frequency line 2, a terminal portion 2a (shown in FIG. 1B) to be connected with a high frequency package is formed.

A high frequency package 5 (switching device) having a first switching element 3 and a second switching element 4 hermetically sealed therein is mounted on the wiring board 1. This high frequency package 5 comprises, as shown in FIG. 1B, a dielectric substrate 6, an input terminal 8a and an output terminal 8b provided beneath the dielectric substrate 6.

These terminals 8a and 8b, shown in FIG. 1B, are connected by a high frequency line 7, shown in FIG. 1A, that is formed on the dielectric substrate 6. This high frequency line comprises a microstrip line including a signal line 7a and a ground layer 7b, each shown in FIG. 1B. Meanwhile, the signal line 7a formed on the inside surface of the dielectric substrate 6 being sealed in and the signal line 7a formed on the rear surface of the dielectric substrate 6 are connected by a through-hole conductor 9, shown in FIG. 1B, penetrating the dielectric substrate 6, without electrically contacting with the ground layer 7b.

The input terminal 8a of this high frequency package 5 is connected with the terminal portion 2a on the wiring board 1 by means of a conductive adhesive 10, shown in FIG. 1B, such as solder. Also, the output terminal 8b of the high frequency package 5 is connected with a terminal portion 11a, shown in FIG. 1B, formed on one end of the high frequency line 11 formed on the wiring board 1 by means of the conductive adhesive 10.

In addition, a high frequency package 14 (down converter device) comprising a mixer element 12 and a high frequency oscillator 13 hermetically sealed therein is connected with the other end part of the high frequency line 11 on the wiring board 1. This high frequency package 14 has a structure similar to that of the high frequency package 5, and includes a dielectric substrate 15, shown in FIG. 1B, an input terminal 16a, shown in FIG. 1B, an intermediate frequency terminal 16b, shown in FIG. 1A, and a high frequency line 17, shown in FIG. 1B, comprising a microstrip line.

The input terminal 16a of the high frequency package 14 is connected with the terminal portion 11b (See FIG. 1B) of the high frequency line 11 by means of the conductive adhesive 10. Also, the intermediate frequency terminal 16b is connected with a terminal portion of an intermediate frequency line 18, shown in FIG. 1A, formed on the wiring board 1 by means of the conductive adhesive.

In such a high frequency module, high frequency signals introduced by the high frequency line 2 are screened by the switching device comprising a high frequency package 5 within which the first switching element 3 and the second switching element 4 are hermetically sealed. The input signals that have been screened by the switching device are further transmitted through the high frequency line 11 to the down converter device comprising the high frequency package 14 within which the mixer element 12 and the high frequency oscillator 13 are hermetically sealed. The signals are converted by the down converter device into intermediate frequency signals having a frequency of 1 GHz, and outputted to the intermediate frequency line 18 on the wiring board 1.

When a high frequency module has such a structure as above, in a series of paths along which high frequency signals are transmitted, reflection of the signals is likely to occur in areas where each device is connected with the line 2, 11 or 18. This causes transmission loss of the high frequency signals to be great.

Also, in the case of transmitting high frequency signals along a transmission line such as a microstrip line in such a high frequency module, due to its high frequency, the transmission loss thereof is large by nature. This has been a problem in assembling such a high frequency module. Reflection of signals in the connection areas is not only a problem of further increased loss. It also includes a problem that the reflected signals can cause malfunction of the elements and oscillation of the circuit.

Reflection of high frequency signals is generated at discontinuous points of the transmission line, namely, connection points between the devices and lines 7, 11, and 18 on the wiring board 1. The behavior of the reflection changes depending on the length of the line between a discontinuous point and another discontinuous point.

Figure 2:
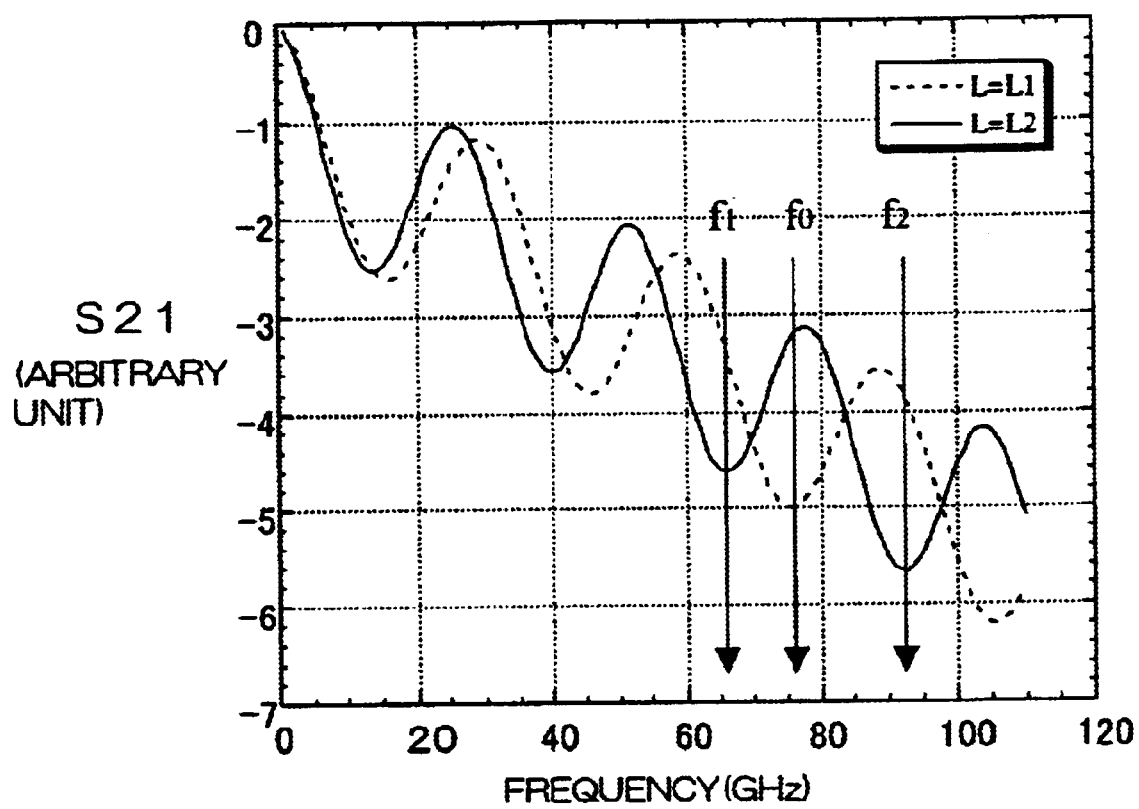
FIG. 2 is a graph showing a transmission characteristic for explaining the principle of the present invention.

FIG. 2 is a graph for explaining the principle of this invention, which shows each transmission characteristic when a high frequency line is sandwiched between a discontinuous point and another discontinuous point, where the length of the high frequency line between the two discontinuous points is L1 or L2 (L1<L2). The vertical axis indicates transmittance S21 (arbitrary unit), and the horizontal axis indicates frequency (GHz).

As shown in FIG. 2, in either case, the transmission characteristic of the high frequency line between two discontinuous points has the property of cyclically varying in relation to the frequency.

The reflection of signals is small at parts (peaks) where the transmittance is large, and is large at parts (troughs) where the transmittance is small. According to the cyclic variation curve in FIG. 2, when the signal frequency is 77 GHz ($f_0$), the curve is at a trough in the case of the high frequency line length L1, where the loss is large. However, in the case of the high frequency line length L2 that is a little longer than L1, the curve is at a peak, where the loss is small.

This invention is one that utilizes this transmission characteristic of high frequency signals such that when there is discontinuity in a transmission line such as a connection point between the line on the wiring board and a device, the length of the transmission line between a discontinuous point and another discontinuous point is adjusted so as to reduce loss due to reflection.

In the present invention, the length of the transmission line between the discontinuous points is adjusted so that the frequency of signals transmitted along the transmission line is located at a peak part of the cyclic variation curve of the transmission characteristic.

In the high frequency module discussed referring to FIGS. 1A, 1B, high frequency lines sandwiched between discontinuous points are as follows:

1) High frequency line 2 connecting an antenna and the high frequency package 5 that functions as a switching device.
2) A group of high frequency lines in the high frequency package 5 serving as a switching device, which are included in the route from the input terminal 8 via the high frequency line 7 and the elements 3, 4 to the output terminal 8*b*.
3) High frequency line 11 from the terminal portion 11*a* to the other terminal portion 11*b* connecting two high frequency packages 5 and 14 on the wiring board 1.
4) A group of high frequency lines in the high frequency package 14 that functions as a down converter device, which are included in the route from the input terminal 16*a* via the high frequency line 17 and the elements 12, 13 to the intermediate frequency terminal 16*b*.

In particular, the high frequency lines listed in 2) 4) and/or 3) greatly influence the loss of the high frequency module.

It is therefore desirable to control these lines so as to reduce transmittance loss.

More specifically, they should be controlled so as to satisfy the following mathematical formula:

$$f_1 + \{(f_2 - f_1)/4\} \leq f_0 \leq f_2 - \{(f_2 - f_1)/4\} \quad \text{[Formula 1]}$$

where $f_0$ represents the frequency of signals transmitted along the high frequency line, $f_1$ represents the frequency on the cyclic variation curve of the transmission characteristic in each line at a trough part on the lower frequency side adjacent to $f_0$, and $f_2$ represents the frequency on the curve at a trough part on the higher frequency side adjacent to $f_0$ (See FIG. 2).

This is a formula defining the peak part of the cyclic variation curve, which means that one peak part is located within a frequency range of inner ½ of the frequency range between the trough parts adjacent to the peak part.

In order to make the transmission characteristic of a high frequency line satisfy the specific relation described above, it is desirable that the length L of each line is represented as: $L = (2n+1)\lambda/4$ (n is an integral number, and $\lambda$ is wavelength of the signal frequency).

In the present invention, as a high frequency package to be incorporated into a high frequency module, a high frequency package that satisfies the above stated relations is mounted on a wiring board so that it is possible to reduce at least transmittance loss within the high frequency package in the high frequency module.

In addition, by mounting high frequency packages on a wiring board that satisfies the above relations, transmittance loss can be reduced at least in the line between the high frequency packages on the wiring board.

Furthermore, by incorporating high frequency packages that satisfy the above relations into a wiring board that satisfies the above relations, transmittance loss within the high frequency packages as well as that in the line between the high frequency packages on the wiring board can be reduced so that the overall transmittance loss in the high frequency module can be further decreased.

In addition, regulating the above described lines 3) and 4) so as to satisfy the above relations enables transmittance loss of the high frequency module to decrease further.

EXAMPLE

Figure 3A:
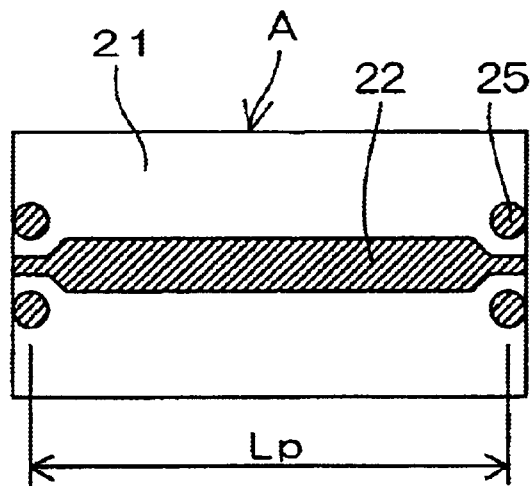
FIG. 3A is a schematic plan view of a high frequency package for evaluation in an example.

A high frequency package A for evaluation was fabricated in order to examine how lengths of a high frequency transmission line influence the signal reflection. The pattern of the rear surface of the dielectric substrate of the frequency package A is shown in FIG. 3A, the pattern of a wiring board B is shown in FIG. 3B, and a schematic sectional view of the high frequency package A for evaluation mounted on the wiring board B is shown in FIG. 3C.

The high frequency package A for evaluation has a dielectric substrate 21 comprising alumina ceramics and having a signal conductor 22 on its rear surface, and a ground layer 23 inside the substrate. As shown in FIG. 3C, the signal conductor 22 and the ground layer 23 constitute a microstrip line 24. As shown in FIG. 3A, the end parts of the signal conductor 22 are narrowed in the end portions of the dielectric substrate 21, and ground patterns 25 electrically connected with the ground layer 23 are formed in both sides of the end parts of the signal conductor 22. The end parts of the signal conductor 22 and the ground patterns 25 form connection terminals.

Figure 3B:
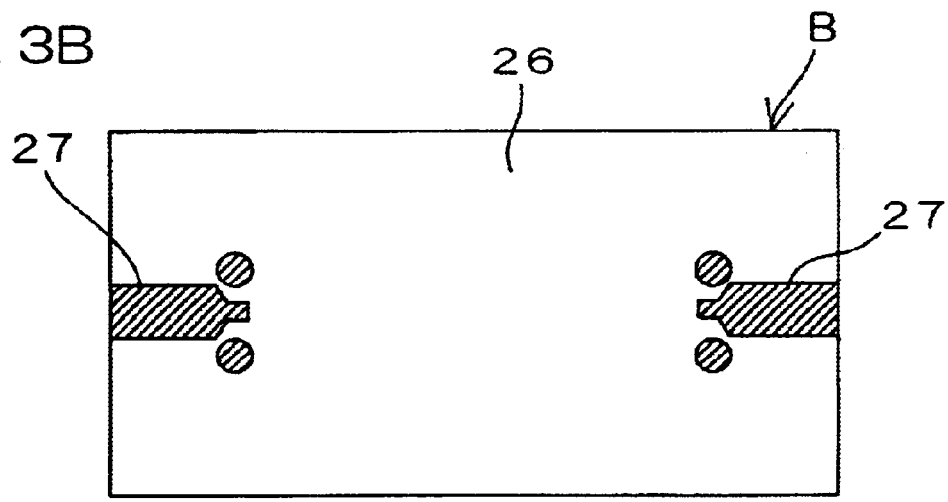
FIG. 3B is a schematic plan view of a wiring board.
Figure 3C:
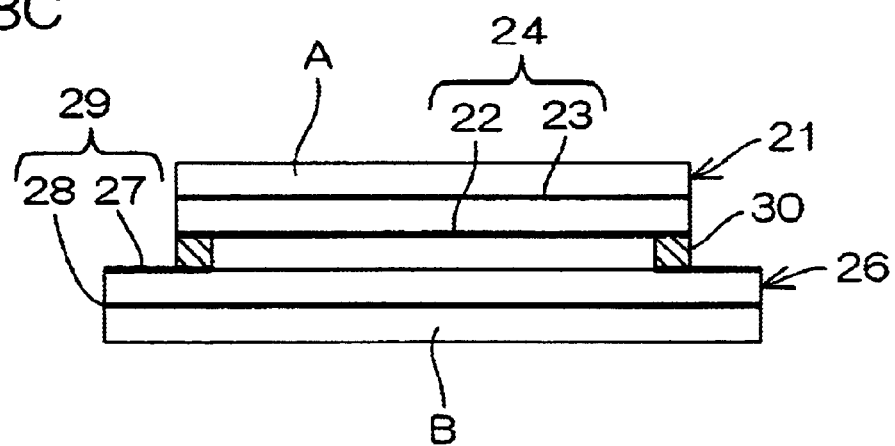
FIG. 3C is a schematic sectional view of the high frequency package for evaluation mounted on the wiring board.

Similarly, the wiring board B (See FIG. 3C) has a dielectric substrate 26, shown in FIG. 3B and FIG. 3C comprising alumina ceramics and having a signal conductor 27 on its front surface and a ground layer 28 inside as shown in FIG. 3B. The signal conductor 27 and the ground layer 28 constitute a microstrip line 29 as shown in FIG. 3C.

The high frequency package A for evaluation is mounted on the surfaces of the terminal portions of the microstrip line 29 on the wiring board B by means of solder 30 as shown in FIG. 3C.

Figure 4A:
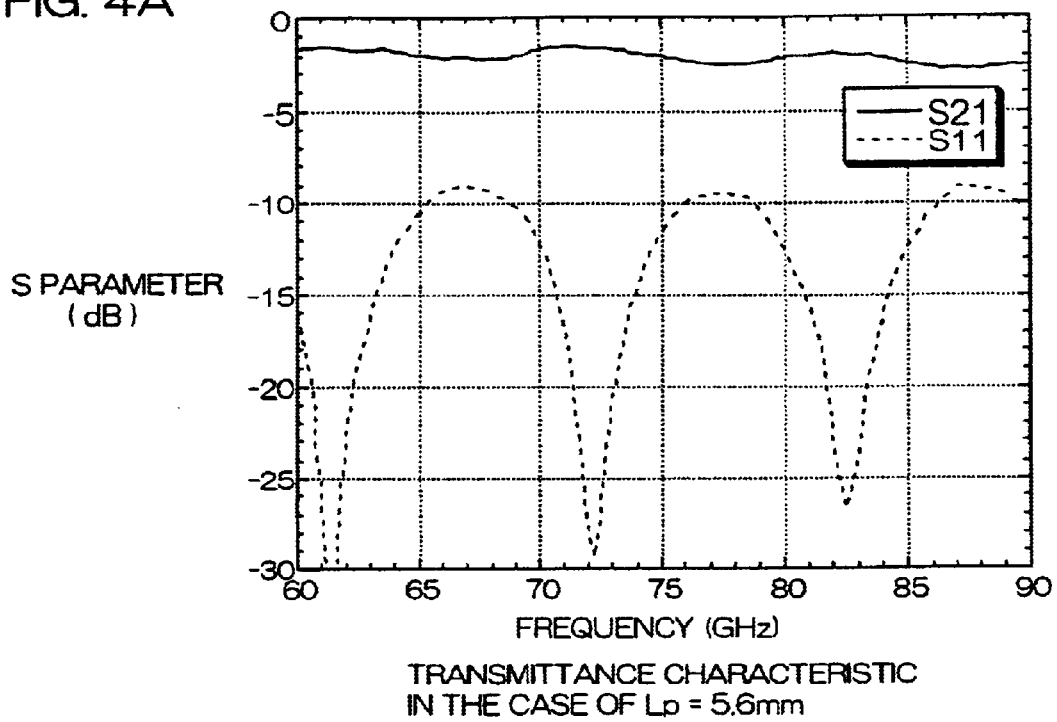
FIG. 4A is a graph showing a transmission characteristic of an assembled sample with high frequency package A1 for evaluation in the example.
Figure 4B:
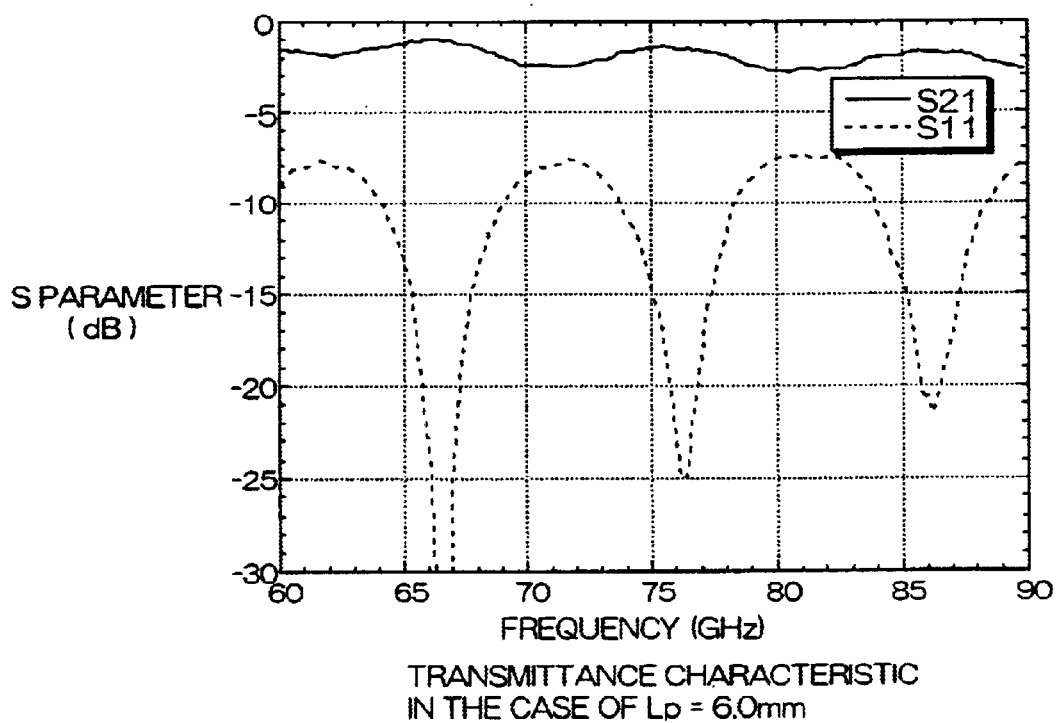
FIG. 4B is a graph showing a transmission characteristic of an assembled sample with high frequency package A2 for evaluation.
Figure 5:
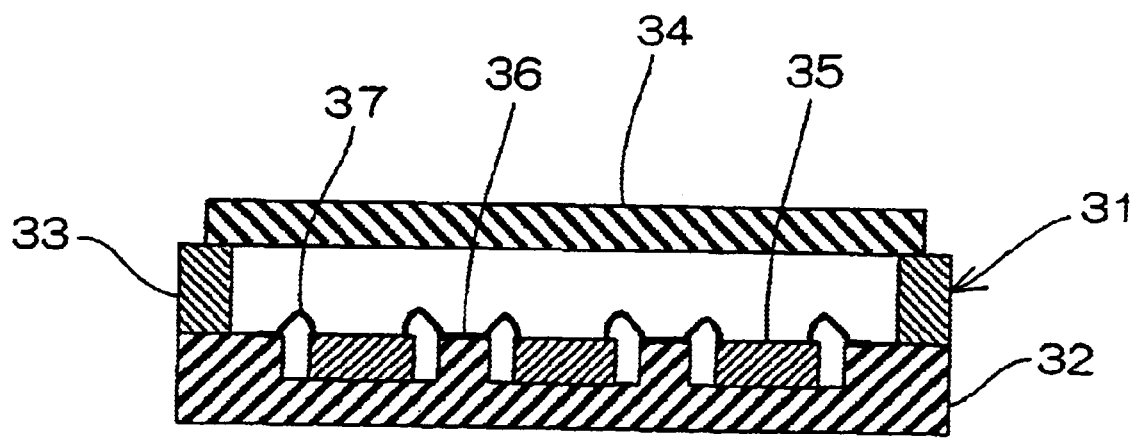
FIG. 5 is a schematic sectional view illustrating the structure of a known multichip high frequency module.

A high frequency package A1, corresponding to the transmittance characteristic of FIG. 4A having a distance between the connection terminals Lp (See FIG. 3A) of 5.6 mm, and a high frequency package A2, corresponding to the transmittance characteristic of FIG. 4B having a distance between the connection terminals Lp of 6.0 mm were fabricated for the high frequency package A for evaluation. These packages were respectively mounted on the wiring board B (See FIG. 3C), and high frequency signals were transmitted. The influence of the connection areas was evaluated.

The transmission characteristic (reflection characteristic, insertion loss) between the input terminal and the output terminal on the wiring board B in the frequency range of 60–90 GHz was measured. A result of the measurement in the case of Lp=5.6 mm (=14×$\lambda$/4) is shown in FIG. 4A, and that in the case of Lp=6.0 mm (=15×$\lambda$/4) is shown in FIG. 4B. It is apparent that, in both cases, the transmission characteristic of the high frequency line cyclically varies in relation to the variation of the frequency.

When signals having a frequency of 76 GHz (wavelength $\lambda$=1.49 mm) were transmitted in both of the high frequency packages, the high frequency package A1 had a signal reflection (S11) of –10.0 dB, and a loss (S21) of –2.3 dB (FIG. 4A).

On the other hand, the high frequency package A2 had a signal reflection (S11) of –22.9 dB, and a loss (S21) of –1.6 dB (FIG. 4B).

When the high frequency package A1 (FIG. 4A) is compared with the high frequency package A2 (FIG. 4B), the high frequency package A1 has larger signal reflection (S11), as well as larger loss (S21).

As the result above shows, when signals having a frequency of 76 GHz are transmitted, transmission loss can be reduced by using the high frequency package A2 in which the frequency of signals transmitted along the high frequency line is located at a peak part of the cyclic variation curve of the transmission characteristic.

As is shown above, the cyclic variation of the transmission characteristic in relation to the frequency corresponds to the distance between the connection terminals. When the length of the transmission line between the connection areas is an integral multiple of one-half the wavelength of the signals, the reflection is a minimum value, and the loss is also a minimum value accordingly.

The effective dielectric constant of the microstrip line of each of the high frequency packages A1 and A2 is approximately 6. In each case of the high frequency packages A1 and A2 for evaluation, the length of the transmission line between the connection areas becomes an integral multiple of one-half the wavelength of the signals at every 10.1 GHz, 9.4 GHz, respectively, in calculation, which correspond to the above measurement.

Therefore, when mounting a high frequency package, by adjusting the length of the transmission line between the connection areas to an integral multiple of one-half the wavelength of the signals, the package has a minimum reflection, having a minimum loss accordingly. This allows for reduction of loss due to the connection, thereby appropriately realizing a high frequency module dealing with frequencies of 10 GHz or more.

A surface-mounting type high frequency package in which soldering is employed was used as the high frequency package for evaluation in FIGS. 4A and 4B. However, the structure of the high frequency package according to this invention is not limited to the above one, but may be arranged such that the connection terminals are connected with the wiring board by means of wire, which will have the same effect.

Based on the results described above, a high frequency module is arranged in the manner of FIGS. 1A–1C according to this invention, where the connection terminals 11a and 11b of the high frequency line 11 connecting the high frequency packages 5 and 14 on the wiring board 1 has an interval length Lb of, for example, 0.4 mm or 1.2 mm, which is (2n+1)$\lambda$/4 (n is an integral number). In this way, the frequency of signals transmitted along the high frequency line is located at a peak part of the cyclic variation curve of the transmission characteristic so that the reflection is at a minimum, and the loss is accordingly at a minimum, thereby reducing loss caused by the connection. As a result, it is possible to reduce loss of signals having frequencies of 10 GHz or more in the high frequency line connecting the high frequency packages together on the wiring board.

In addition, by mounting such high frequency packages in which the lengths of the lines are adjusted on the wiring board in which the length of the line is adjusted as above, this invention has made it possible to provide a high frequency module with reduced transmittance loss.

What is claimed is:

1. A high frequency package comprising:
   a dielectric substrate provided with an input terminal and an output terminal;
   a high frequency element mounted on the surface of the dielectric substrate; and
   a high frequency line disposed on the dielectric substrate for connecting the high frequency element with the input terminal and with the output terminal;
   wherein a transmission characteristic from the input terminal to the output terminal has the property of cyclically varying in relation to frequency, and the frequency of signals transmitted along the high frequency line corresponds to that at a part of the cyclic variation curve of the transmission characteristic where transmittance is large.

2. The high frequency package according to claim 1, which satisfies the formula:

$$f_1+\{(f_2-f_1)/4\}<f_0<f_2-\{(f_2-f_1)/4\}$$

where $f_0$ represents the frequency of signals transmitted along the high frequency line, $f_1$ represents the frequency on the cyclic variation curve of the transmission characteristic at a trough part on the lower frequency side adjacent to $f_0$, and $f_2$ represents the frequency on the curve at a trough part on the higher frequency side adjacent to $f_0$.

3. The high frequency package according to claim 1, wherein the length of the high frequency line from the input terminal to the output terminal is (2n+1)$\lambda$/4 where n is an integral number, and $\lambda$ is the wavelength of the signal frequency transmitted along the high frequency line.

4. The high frequency package according to claim 1, wherein the high frequency element serves as a switching device.

5. A wiring board for mounting at least two high frequency packages thereon, wherein a transmission characteristic from one terminal portion to the other terminal portion on a high frequency line connecting the two high frequency packages has the property of cyclically varying in relation to frequency, and the frequency of signals transmitted along the high frequency line corresponds to that at a part of the cyclic variation curve of the transmission characteristic where transmittance is large.

6. The wiring board according to claim 5, which satisfies the formula:

$$f_1 + \{(f_2 - f_1)/4\} < f_0 < f_2 - \{(f_2 - f_1)/4\}$$

where $f_0$ represents the frequency of signals transmitted along the high frequency line, $f_1$ represents the frequency on the cyclic variation curve of the transmission characteristic at a trough part on the lower frequency side adjacent to $f_0$, and $f_2$ represents the frequency on the curve at a trough part on the higher frequency side adjacent to $f_0$.

7. The wiring board according to claim 5, wherein the length of the high frequency line from one terminal portion to the other terminal portion is $(2n+1)\lambda/4$ where n is an integral number, and $\lambda$ is the wavelength of the signal frequency transmitted along the high frequency line.

8. The wiring board according to claim 5, wherein one of the two high frequency packages serves as a switching device.

9. A high frequency module comprising at least one high frequency package mounted on a wiring board, each high frequency package comprising:

a dielectric substrate provided with an input terminal and an output terminal;

a high frequency element mounted on the surface of the dielectric substrate; and a high frequency line disposed on the dielectric substrate for connecting the high frequency element with the input terminal and with the output terminal, wherein a transmission characteristic from the input terminal to the output terminal has the property of cyclically varying in relation to frequency, and the frequency of signals transmitted along the high frequency line corresponds to that at a part of the cyclic variation curve of the transmission characteristic where transmittance is large.

10. A high frequency module comprising at least two high frequency packages and a wiring board, the high frequency packages having input terminals and output terminals being connected to a high frequency line on the wiring board, wherein a transmission characteristic from one terminal portion to the other terminal portion on the high frequency line connecting the two high frequency packages has the property of cyclically varying in relation to frequency, and the frequency of signals transmitted along the high frequency line corresponds to that at a part of the cyclic variation curve of the transmission characteristic where transmittance is large.

11. A high frequency module comprising at least two high frequency packages and a wiring board, each of the high frequency packages comprising:

a dielectric substrate provided with an input terminal and an output terminal;

a high frequency element mounted on the surface of the dielectric substrate; and a first high frequency line disposed on the dielectric substrate for connecting the high frequency element with the input terminal and with the output terminal, wherein a transmission characteristic from the input terminal to the output terminal has the property of cyclically varying in relation to frequency, and the frequency of signals transmitted along the first high frequency line corresponds to that at a part of the cyclic variation curve of the transmission characteristic where transmittance is large, and a transmission characteristic from one terminal portion to the other terminal portion on a second high frequency line connecting the two high frequency packages on the wiring board has the property of cyclically varying in relation to frequency, and the frequency of signals transmitted along the second high frequency line corresponds to that at a part of the cyclic variation curve of the transmission characteristic where transmittance is large.

* * * * *